(12) United States Patent
Liao (10) Patent No.: US 8,269,551 B2
(45) Date of Patent: Sep. 18, 2012

(54) COMPLEX FILTER AND CALIBRATION METHOD

(75) Inventor: Che-Hung Liao, Taichung (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 12/895,775

(22) Filed: Sep. 30, 2010

(65) Prior Publication Data

US 2011/0140771 A1 Jun. 16, 2011

(30) Foreign Application Priority Data

Dec. 10, 2009 (TW) .............................. 98142310 A (51) Int. Cl.
*H04B 1/12* (2006.01)

(52) U.S. Cl. ........ 327/553; 327/557; 455/307; 455/339; 455/340; 375/350

(58) Field of Classification Search .................. None
See application file for complete search history.

(56) References Cited

U.S. PATENT DOCUMENTS

| | | | |
|---|---|---|---|
| 7,098,731 B1 * | 8/2006 | Wyszynski | 327/557 |
| 7,283,840 B2 * | 10/2007 | Cho | 455/552.1 |
| 7,558,556 B1 * | 7/2009 | Moloudi et al. | 455/323 |
| 2004/0002318 A1 * | 1/2004 | Kerth et al. | 455/302 |
| 2009/0102546 A1 * | 4/2009 | Miyagi et al. | 327/557 |
| 2010/0207691 A1 * | 8/2010 | Kim | 330/69 |

* cited by examiner

*Primary Examiner* — Lincoln Donovan
*Assistant Examiner* — Terry L Englund
(74) *Attorney, Agent, or Firm* — Winston Hsu; Scott Margo (57) ABSTRACT

A complex filter for processing an in-phase signal and a quadrature-phase signal includes a first low-pass filter, a second low-pass filter, a connection unit between the first low-pass filter and the second low-pass filter, a first compensation resistor and a second compensation resistor. The first compensation resistor and the second compensation resistor are interlacedly coupled to input resistors of the first low-pass filter and the second low-pass filter.

16 Claims, 11 Drawing Sheets

COMPLEX FILTER AND CALIBRATION METHOD

BACKGROUND OF THE INVENTION

1. Field of the Invention

The present invention relates to a complex filter and calibration method, and more particularly, to a complex filter and calibration method capable of utilizing a small amount of easily integrated compensation resistors to realize phase and amplitude calibration.

2. Description of the Prior Art

In the current wireless communications systems, there are two main architectures of receivers capable of achieving high integration and performing multiple modes. One is low intermediate frequency (low IF) receivers, and the other is direct conversion or named zero-IF receivers. The former can avoid direct current (DC) offset and low frequency noise but may meet image-signal interference. On the contrary, the latter is free from image signal interference but is affected by DC (direct current) offset and low-frequency noise.

Nowadays, low IF architectures are widely applied in transmitters and receivers of the wireless communications systems. Therefore, how to reduce image signal interference in a low IF receiver has become an important issue in the industry and academia community. The most common method in a low IF or very low IF receiver is utilizing a mixer to down-convert radio frequency (RF) signals received from an antenna and obtain a pair of orthogonal signals, and utilizing a complex filter to process the orthogonal signals. Please refer to FIG. 1, which is a schematic diagram of a conventional low IF reception device 10. The low IF reception device 10 is utilized for processing a radio frequency signal RF, and includes a low noise amplifier (LNA) 100, a local oscillator 102, a phase shifter 104, mixers 106 and 108, a complex band-pass filter 110, an analog-to-digital converter (ADC) 112 and a digital signal processor 114. Operating principles of the low IF reception device 10 are well known by those skilled in the art, and thus are briefly illustrated as follows. The LNA 100 is utilized for properly amplifying amplitudes of received signals. The local oscillator 102 is utilized for generating a local oscillating signal for the mixer 106, and the phase shifter 104 is utilized for outputting the local oscillating signal generated by the local oscillator to the mixer 108 after shifting a phase of the local oscillating signal by −90 degree. Therefore, by utilizing the oscillating signals with 90-degree phase difference, the mixers 106, 108 can down-convert the radio frequency signal RF to a specific frequency, and output an in-phase signal I and a quadrature-phase signal Q. The signals I, Q are orthogonal to each other, and mixed with image signals. The complex band-pass filter 110 is utilized for eliminating the image signals within the signals I, Q. Finally, the ADC 112 converts the signals I, Q into digital signals and transmits the digital signals to the digital signal processor 114 for further processing.

Figure 1:
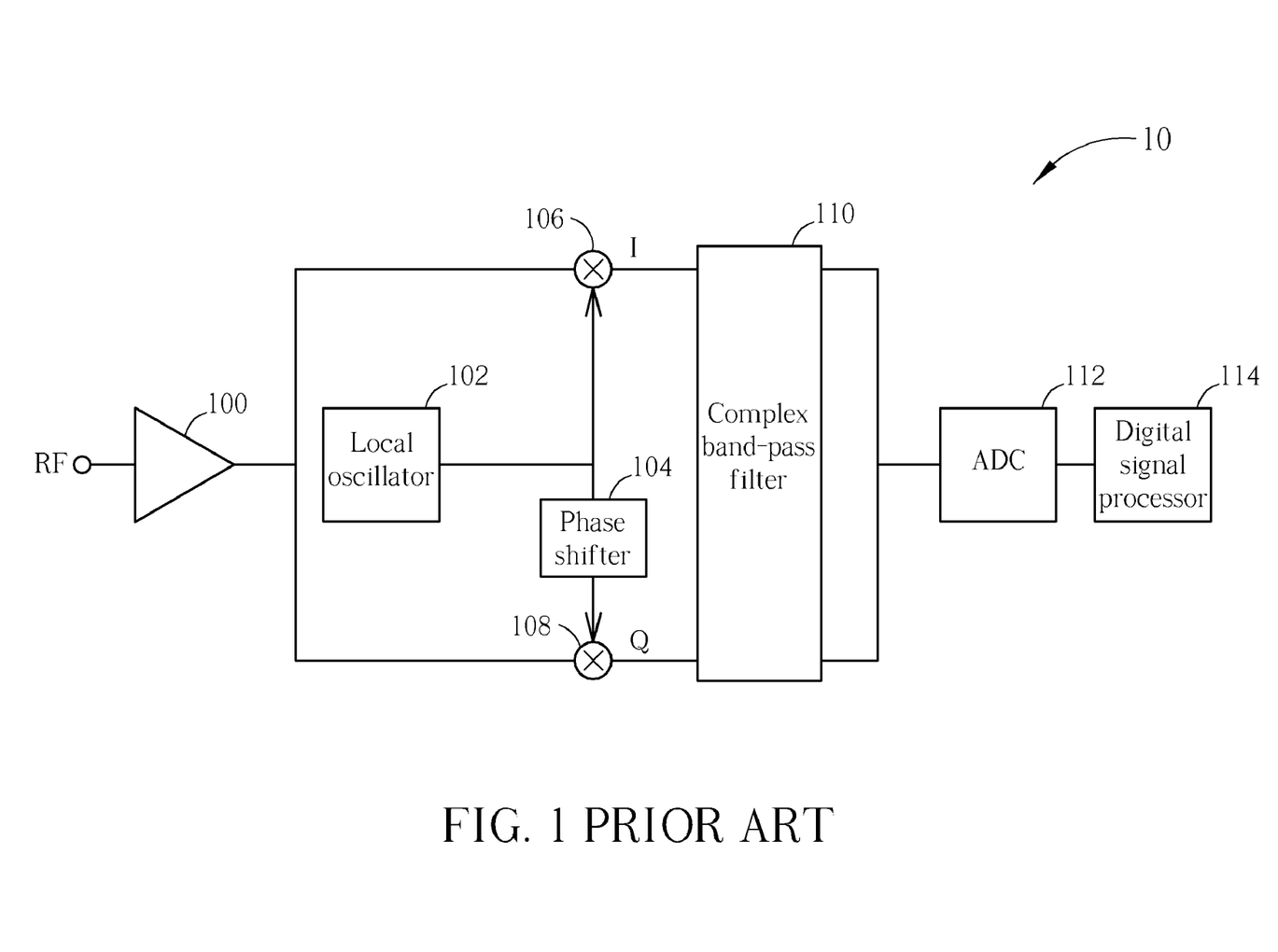
FIG. 1 is a schematic diagram of a conventional low IF reception device.
Figure 2:
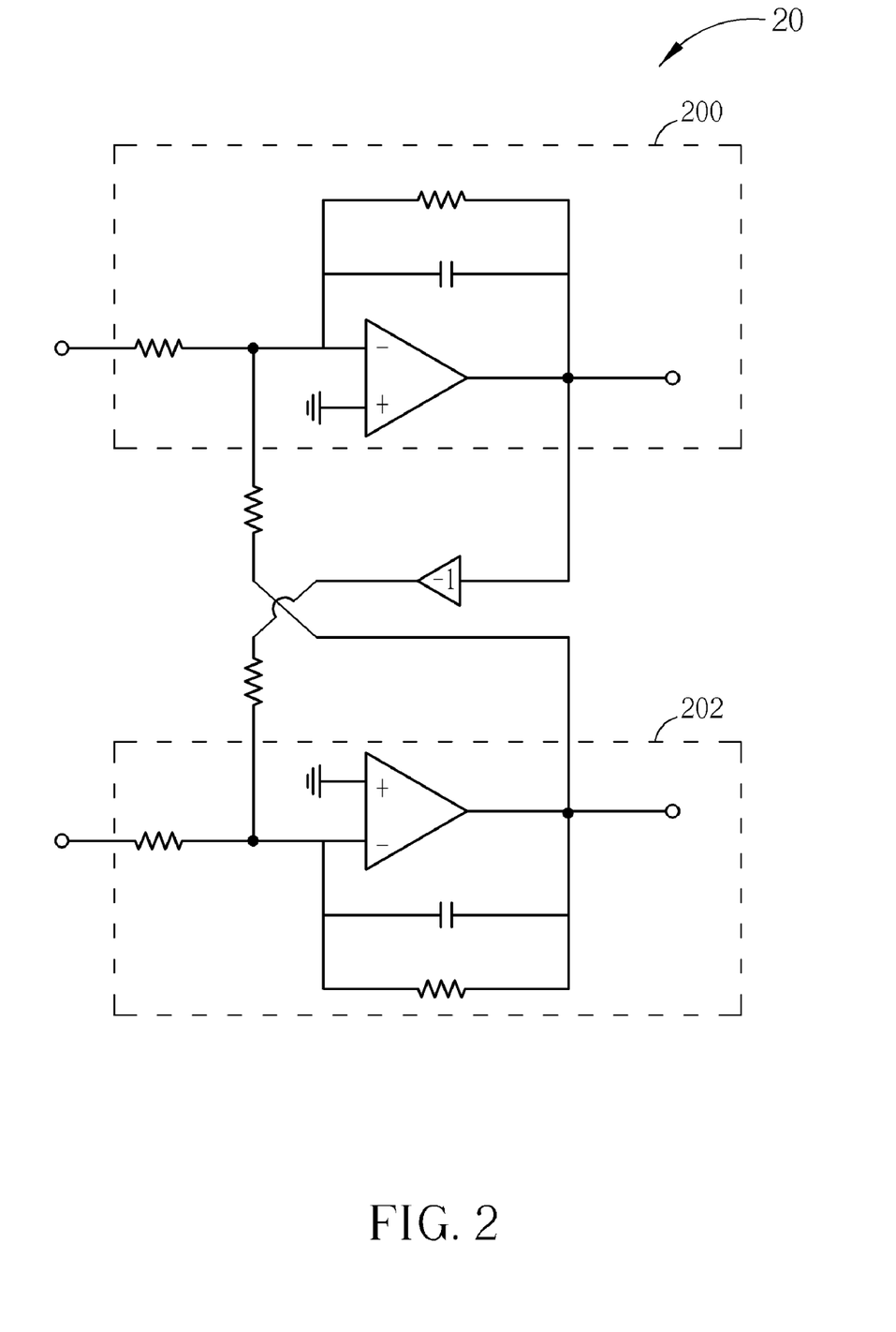
FIG. 2 is a schematic diagram of a first-order leapfrog complex band-pass filter.

In the low IF receiver 10 which separately performs analog and digital operations, an important spirit is that channel selection and image signal elimination are done by the complex band-pass filter 110, i.e. signals are processed under a complex operation architecture, in order to accurately control the signal phases. There are different methods for realizing the complex band-pass filter 110, and one is a leapfrog structure. For example, FIG. 2 is a schematic diagram of a first-order leapfrog complex band-pass filter 20. The first-order complex band-pass filter 20 mainly includes two low-pass filters (also integrators) 200, 202, which are connected by a connection unit including resistors and an inverter. Except for the example shown FIG. 2, multi-order, differential leapfrog complex band-pass filters can also be applied, in order to shift frequency responses of the low-pass filters to a required center frequency, so as to achieve complex band-pass filtering.

In addition, since the low IF reception device 10 is divided into analog and digital operations, if the analog part (i.e. before ADC 112) has phase or gain mismatch, it is hard to completely eliminate the mismatch via the digital part. Therefore, the prior art provides different methods focusing on calibrating phases and amplitudes of the orthogonal signals I, Q, for eliminating image signals. However, most of the conventional calibration methods are established upon complicated computations, and cannot be realized by a small amount of elements or elements capable of being easily integrated into the receivers. Besides, extra complicated computations and excessive elements for eliminating image signals can induce power consumption issues.

SUMMARY OF THE INVENTION

It is therefore an objective of the present invention to provide a complex filter and calibration method.

The present invention discloses a complex filter for processing an in-phase signal and a quadrature-phase signal. The complex filter includes a first low-pass filter, for receiving the in-phase signal, and outputting a filtering result, a second low-pass filter, for receiving the quadrature-phase signal, and outputting another filtering result, a connection unit, coupled between the first low-pass filter and the second low-pass filter, a first compensation resistor, having one terminal coupled to a terminal of a first input resistor of the first low-pass filter, which does not receives the in-phase signal, and another terminal coupled to a terminal of a second input resistor of the second low-pass filter, which receives the quadrature-phase signal, and a second compensation resistor, having one terminal coupled to a terminal of the second input resistor, which does not receive the quadrature-phase signal, and another terminal coupled to a terminal of the first input resistor, which receives the in-phase signal.

The present invention further discloses a calibration method for eliminating a mismatch between an in-phase signal and a quadrature-phase signal in a receiver. The receiver includes a complex filter for filtering image signals of the in-phase signal and the quadrature-phase signal, a first compensation resistor having one terminal coupled to a terminal of a first input resistor of the complex filter, which does not receive the in-phase signal, and another terminal coupled to a terminal of a second input resistor of the complex filter, which receives the quadrature-phase signal, and a second compensation resistor having one terminal coupled to a terminal of the second input resistor, which does not receive the quadrature-phase signal, and another terminal coupled to a terminal of the first input resistor, which receives the in-phase signal. The calibration method includes receiving the in-phase signal and the quadrature-phase signal; and determining a ratio of the second input resistor to the first input resistor according to an amplitude mismatch between the in-phase signal and the quadrature-phase signal.

These and other objectives of the present invention will no doubt become obvious to those of ordinary skill in the art after reading the following detailed description of the preferred embodiment that is illustrated in the various figures and drawings.

DETAILED DESCRIPTION

The present invention utilizes a small amount of easily integrated compensation elements to improve mismatch between the in-phase signal I and the quadrature-phase signal Q. The concept of the present invention is illustrated as follows.

Figure 3A:
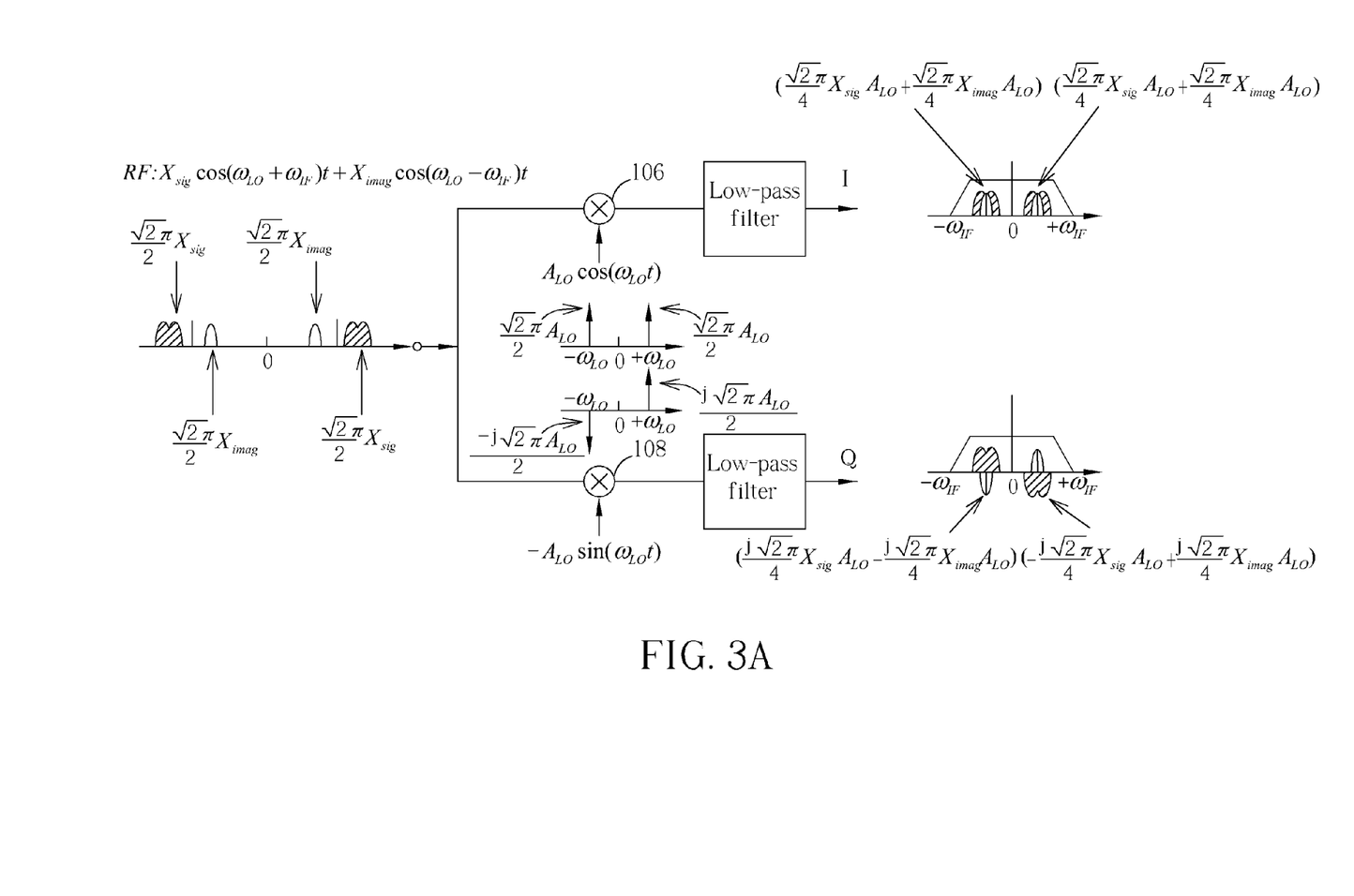
FIG. 3A is a schematic diagram of signals when the low IF reception device shown in FIG. 1 does not have mismatch.

First, take FIG. 1 for example, when the in-phase signal I and the quadrature-phase signal Q are matched, the oscillating signals of the mixers 106, 108 have the same amplitude and a 90-degree phase difference, and thus related signals can be expressed as FIG. 3A. In FIG. 3A, for simplicity, a radio frequency signal RF with a limited bandwidth can be expressed as $X_{sig} \cos(\omega_{LO}+\omega_{IF})t + X_{imag} \cos(\omega_{LO}+\omega_{IF})t$, where $X_{sig}$ denotes a component of required signal, and $X_{imag}$ denotes a component of the image signal. $A_{LO} \cos(\omega_{LO}t)$ and $A_{LO} \sin(\omega_{LO}t)$ and denote a local oscillating signal and a -90 degree phase shift signal of the local oscillating signal, meaning that amplitudes and phases are matched. In addition, for clearly illustrating the concept of the present invention, mixing results of the mixers 106, 108 further undergo low-pass filtering processes, for filtering out high frequency components. Therefore, after the mixers 106, 108 and the low-pass filtering processes, the in-phase signal I and the quadrature-phase signal Q include a real component $$X_{re} = \frac{\sqrt{2\pi}}{4} X_{imag} A_{LO}$$

and an imaginary component $$X_{im} = -\frac{j\sqrt{2\pi}}{4} X_{imag} A_{LO}$$

of the image signal, respectively.

Figure 3B:
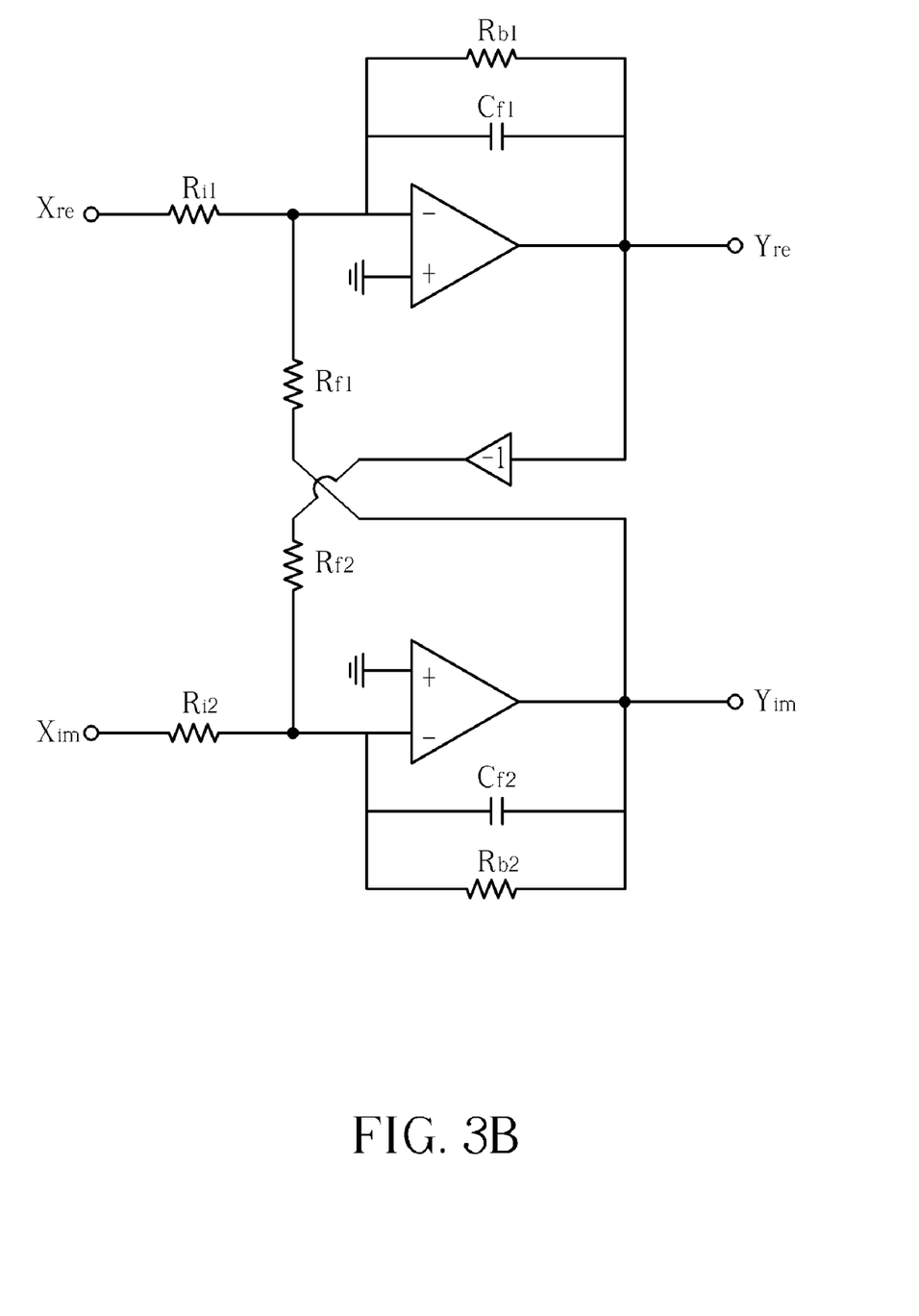
FIG. 3B is a schematic diagram of a first-order leapfrog complex band-pass filter.

Then, after the real component $$X_{re} = \frac{\sqrt{2\pi}}{4} X_{imag} A_{LO}$$

and the imaginary component $$X_{im} = -\frac{j\sqrt{2\pi}}{4} X_{imag} A_{LO}$$

of the image signal pass through a first-order complex band-pass filter shown in FIG. 3B, the following equations can be obtained:

$$Y_{re(-\omega_{IF}),wo} = \frac{R_{b1}R_{f2}\left[R_{b2}X_{im} - R_{f1}\frac{R_{i2}}{R_{i1}}(1+R_{b2}sC_{f2})X_{re}\right]}{R_{i2}[R_{b1}R_{b2} + R_{f1}R_{f2}(1+R_{b1}sC_{f1})(1+R_{b2}sC_{f2})]},$$

and $$Y_{im(-\omega_{IF}),wo} = \frac{-R_{b2}R_{f1}\left[R_{b1}\frac{R_{i2}}{R_{i1}}X_{re} + R_{f2}(1+R_{b1}sC_{f1})X_{im}\right]}{R_{i2}[R_{b1}R_{b2} + R_{f1}R_{f2}(1+R_{b1}sC_{f1})(1+R_{b2}sC_{f2})]}.$$

Figure 4:
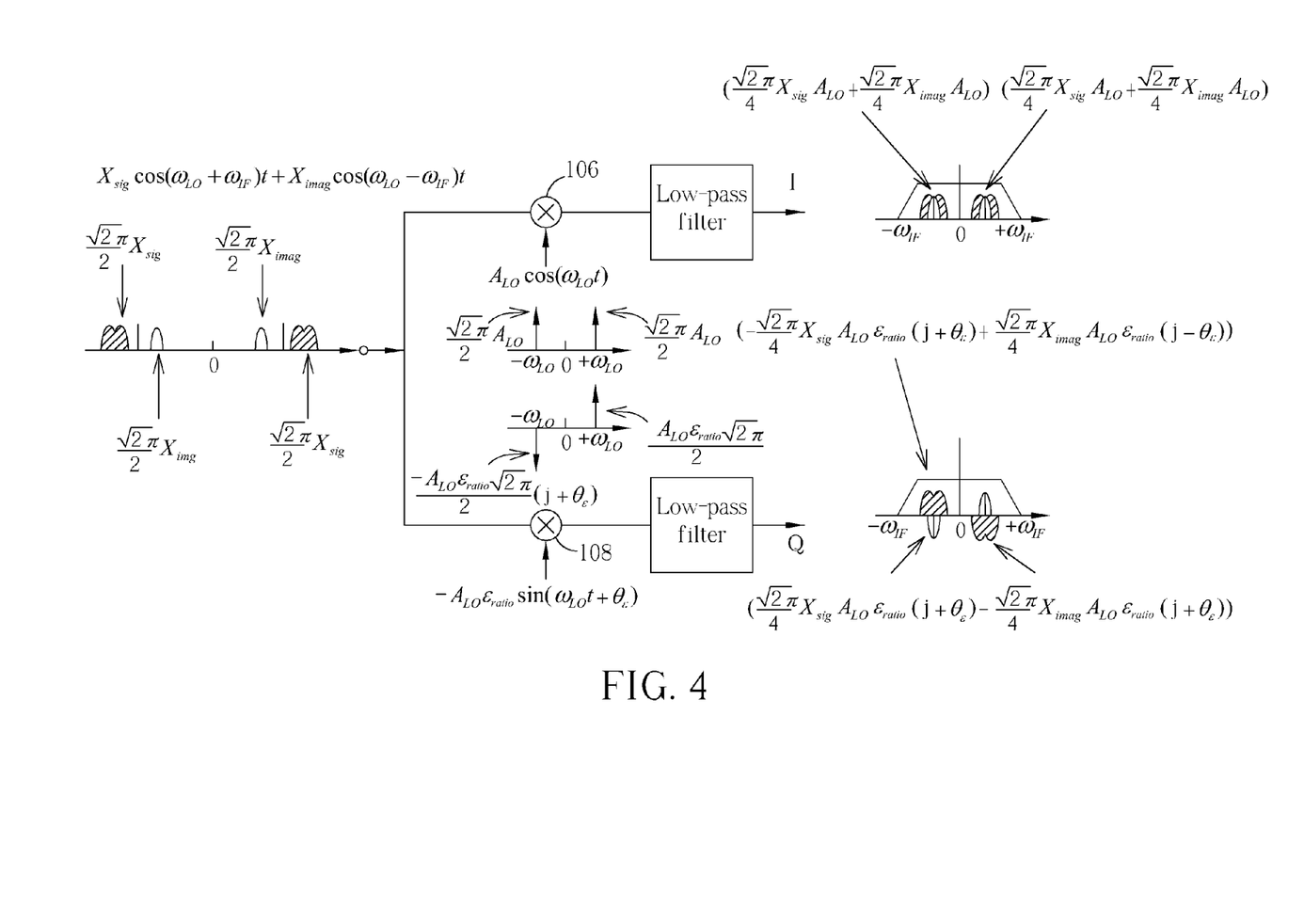
FIG. 4 is a schematic diagram of signals when the low IF reception device shown in FIG. 1 has mismatch.

If an analog part of the receiver has a phase or gain mismatch, it can be equivalently expressed as a mismatch between oscillating signals such as sinusoidal signals. Therefore, a gain mismatch can be expressed as an amplitude ratio $\epsilon_{ratio}$ between the oscillating signals, and a phase mismatch can be expressed as a phase difference $\theta_\epsilon$ between the oscillating signals, as shown in FIG. 4. As can be seen from FIG. 4, when amplitudes and phases of the oscillating signals are mismatched, the real component of the in-phase signal I and the quadrature-phase signal Q of the image signal is still $$X_{re} = \frac{\sqrt{2\pi}}{4} X_{imag} A_{LO},$$

while the imaginary component becomes $$X_{im} = -\frac{\sqrt{2\pi}}{4} X_{imag} A_{LO} \epsilon_{ratio}(j + \theta_\epsilon).$$

Figure 5:
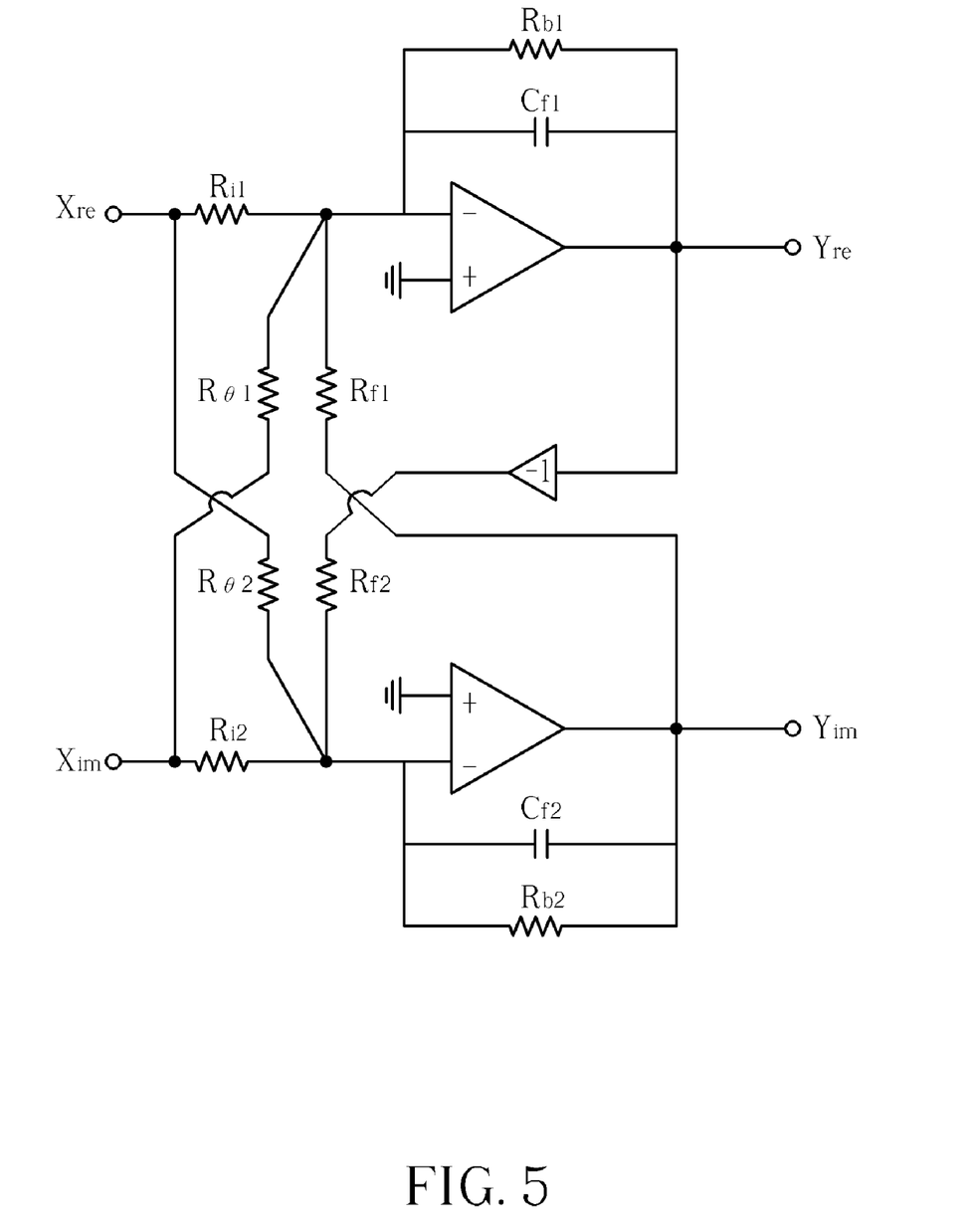
FIG. 5 is a schematic diagram of a first-order leapfrog complex band-pass filter according to an embodiment of the present invention.

In order to eliminate affection caused by the amplitude and/or phase mismatch between the oscillating signals, an embodiment of the present invention adds resistors $R_{\theta 1}$, $R_{\theta 2}$ in the first-order complex band-pass filter of FIG. 3B, as shown in FIG. 5, and the resistances of resistors $R_{\theta 1}$, $R_{\theta 2}$ can be determined as follows.

When the amplitudes and phases of the oscillating signals are mismatched, the following equations can be obtained after the real component $$X_{re} = \frac{\sqrt{2\pi}}{4} X_{imag} A_{LO}$$

and the imaginary component $$X_{im} = -\frac{\sqrt{2\pi}}{4} X_{imag} A_{LO} \varepsilon_{ratio}(j + \theta_\varepsilon)$$

of the image signals pass through the first-order complex band-pass filter shown in FIG. 5:

$$Y_{re(-\omega_{IF}),wi} = \frac{-\sqrt{2\pi} R_{b1} R_{f2} \left[ jR_{b2}\varepsilon_{ratio} + R_{f1} \frac{R_{i2}}{R_{i1}}(1 + R_{b2}sC_{f2}) \right] X_{imag} A_{LO}}{4R_{i2}[R_{b1}R_{b2} + R_{f1}R_{f2}(1 + R_{b1}sC_{f1})(1 + R_{b2}sC_{f2})]} +$$

$$\frac{R_{b1} R_{f2} \left[ R_{b2}\left(\frac{R_{i2}}{R_{\theta2}} - \varepsilon_{ratio}\theta_\varepsilon\right) + \frac{R_{i2}}{R_{\theta1}}(1 + R_{b2}sC_{f2})\varepsilon_{ratio}(j + \theta_\varepsilon) \right]}{R_{i2}[R_{b1}R_{b2} + R_{f1}R_{f2}(1 + R_{b1}sC_{f1})(1 + R_{b2}sC_{f2})]}$$

$$\left[ \frac{\sqrt{2\pi}}{4} X_{imag} A_{LO} \right],$$

and $$Y_{im(-\omega_{IF}),wi} = \frac{-\sqrt{2\pi} R_{b2} R_{f1} \left[ R_{b1} \frac{R_{i2}}{R_{i1}} - jR_{f2}(1 + R_{b1}sC_{f1})\varepsilon_{ratio} \right] X_{imag} A_{LO}}{4R_{i2}[R_{b1}R_{b2} + R_{f1}R_{f2}(1 + R_{b1}sC_{f1})(1 + R_{b2}sC_{f2})]} -$$

$$\frac{R_{b2} R_{f1} \begin{bmatrix} R_{f2}(1 + R_{b1}sC_{f1})\left(\frac{R_{i2}}{R_{\theta2}} - \varepsilon_{ratio}\theta_\varepsilon\right) + \\ R_{b1}\frac{R_{i2}}{R_{\theta1}}\varepsilon_{ratio}(j + \theta_\varepsilon) \end{bmatrix}}{R_{i2}[R_{b1}R_{b2} + R_{f1}R_{f2}(1 + R_{b1}sC_{f1})(1 + R_{b2}sC_{f2})]}$$

$$\left[ \frac{\sqrt{2\pi}}{4} X_{imag} A_{LO} \right].$$

By observing $Y_{re(-\omega_{IF}),wi}$, if let $$\frac{R_{i2}}{R_{i1}} = \varepsilon_{ratio}$$

and $R_{\theta1} \gg R_{i2}$, $Y_{re(-\omega_{IF}),wi}$ can be simplified as:

$$Y_{re(-\omega_{IF}),wi} = Y_{re(-\omega_{IF}),wo} +$$

$$\frac{R_{b1} R_{f2} \left[ R_{b2}\left(\frac{1}{R_{\theta2}} - \frac{\theta_\varepsilon}{R_{i1}}\right) \right]}{[R_{b1}R_{b2} + R_{f1}R_{f2}(1 + R_{b1}sC_{f1})(1 + R_{b2}sC_{f2})]} \left[ \frac{\sqrt{2\pi}}{4} X_{imag} A_{LO} \right];$$

then let $$\frac{1}{R_{\theta2}} = \frac{\theta_\varepsilon}{R_{i1}},$$

the following can be obtained:
$Y_{re(-\omega_{IF}),wi} \approx Y_{re(-\omega_{IF}),wo}$.

Similarly, for $Y_{im(-\omega_{IF}),wi}$, if let $$\frac{R_{i2}}{R_{i1}} = \varepsilon_{ratio}$$

and $R_{\theta1} \gg R_{i2}$, $Y_{im(-\omega_{IF}),wi}$ can be simplified as:

$$Y_{im(-\omega_{IF}),wi} = Y_{im(-\omega_{IF}),wo} -$$

$$\frac{R_{b2} R_{f1} \left[ R_{f2}(1 + R_{b1}sC_{f1})\left(\frac{1}{R_{\theta2}} - \frac{\theta_\varepsilon}{R_{i1}}\right) \right]}{[R_{b1}R_{b2} + R_{f1}R_{f2}(1 + R_{b1}sC_{f1})(1 + R_{b2}sC_{f2})]} \left[ \frac{\sqrt{2\pi}}{4} X_{imag} A_{LO} \right];$$

then let $$\frac{1}{R_{\theta2}} = \frac{\theta_\varepsilon}{R_{i1}},$$

the following can be obtained:
$Y_{im(-\omega_{IF}),wi} \approx Y_{im(-\omega_{IF}),wo}$.

As can be seen from the above, after the resistors $R_{\theta1}$, $R_{\theta2}$ are added, the amplitude mismatch between the in-phase signal I and the quadrature-phase signal Q can be eliminated by adjusting a ratio $$\frac{R_{i2}}{R_{i1}}$$

of two input resistors of the complex band-pass filter, and the phase mismatch between the in-phase signal I and the quadrature-phase signal Q can be eliminated by adjusting a ratio $$\frac{R_{i1}}{R_{\theta2}}$$

of the input resistor $R_{i1}$ to the resistor $R_{\theta2}$. In other words, the amplitude and phase mismatch of the signals I, Q can be independently eliminated. As a result, complexity can be significantly reduced, and more importantly, the present invention adds compensation resistors interlacedly coupled to the input resistors in the original complex band-pass filter, and then adjusts resistances of the input resistors and the compensation resistors regarding amplitude (gain) and phase, respectively, so as to compensate the amplitude and phase mismatches.

In FIG. 1, since the low IF reception device 10 is divided into analog and digital parts, if the analog part has phase or gain mismatch, it is hard to completely eliminate the mismatch via the digital part. In such a situation, the present invention adds the compensation resistors interlacedly coupled to the input resistors in the original complex band-pass filter 110 of leapfrog, and then adjusts the values of the input resistors and the compensation resistors with respect to amplitude and phase portions, such that the amplitude and phase mismatches can be independently compensated, so as to eliminate image signals. As can be seen from the above, the present invention utilize a small amount of compensation resistors, which can be easily integrated with the receiver, and neither needs complicated computations, nor increases excessive energy consumption, so as to significantly improve the conventional structure.

In a word, the present invention adds compensation resistors interlacedly coupled to the input resistors in the complex band-pass filter, and then adjusts the resistances of the input resistors and the compensation resistors with respect to amplitude (gain) and phase, to compensate the amplitude and phase mismatches. Noticeably, the above description and embodiment take the first-order leapfrog complex band-pass filter for example. In practical, the same concept can be applied to a leapfrog complex band-pass filter of any order, such as third order, fifth order, etc., or of a different type, such as differential. A complex band-pass filter can be seen as a combination of a first low-pass filter, a second low-pass filter and connection units between the first low-pass filter and the second low-pass filter. The concept of the present invention is not to modify the original structure of the complex band-pass filter, but to utilize a small amount of easily integrated compensation resistors and realize phase and amplitude calibration. Therefore, those skilled in the art can easily apply the spirit of the present invention to other complex band-pass filters according to the above.

Figure 6:
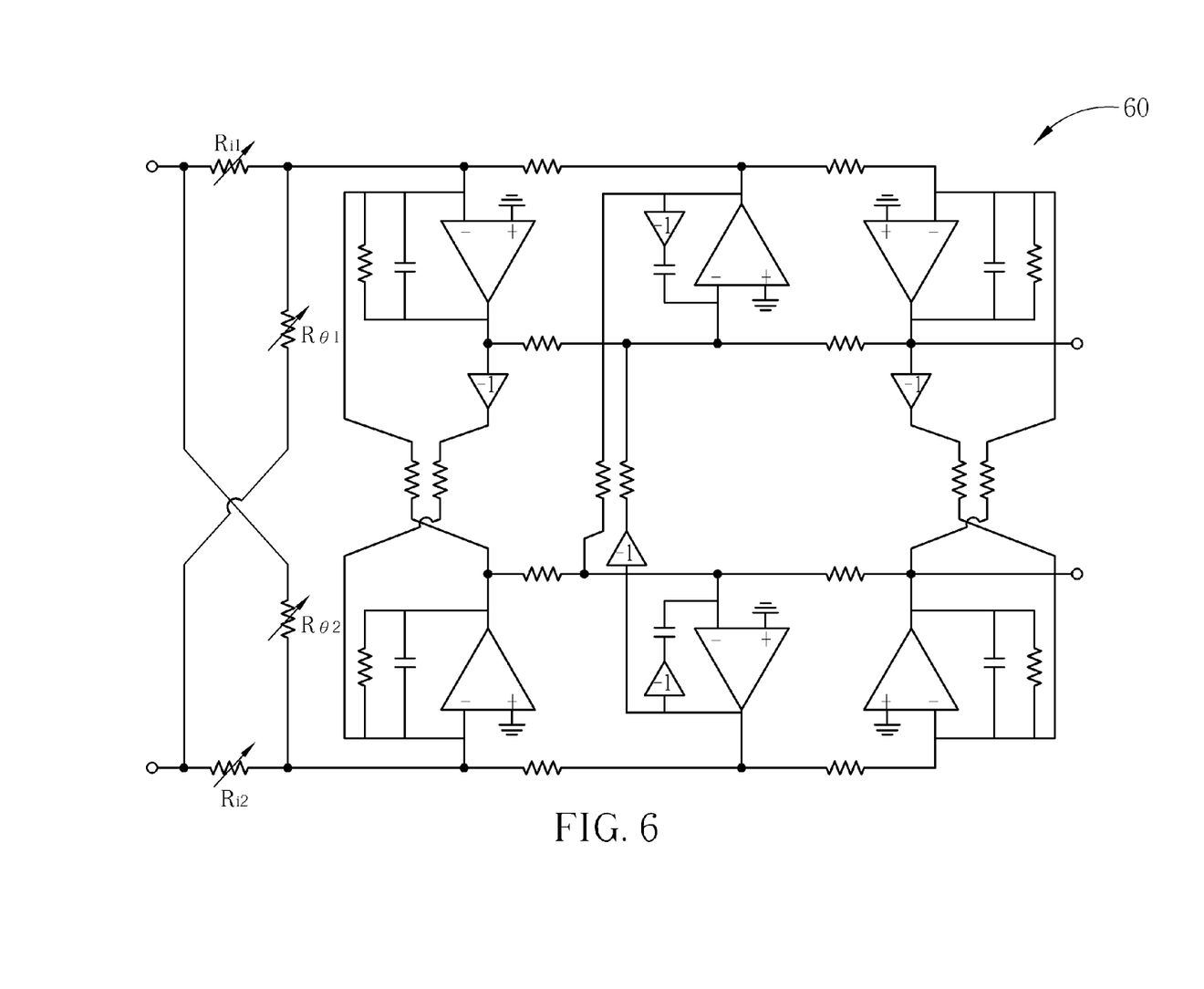
FIG. 6 is a schematic diagram of a third order leapfrog complex band-pass filter according to an embodiment of the present invention.
Figure 7A:
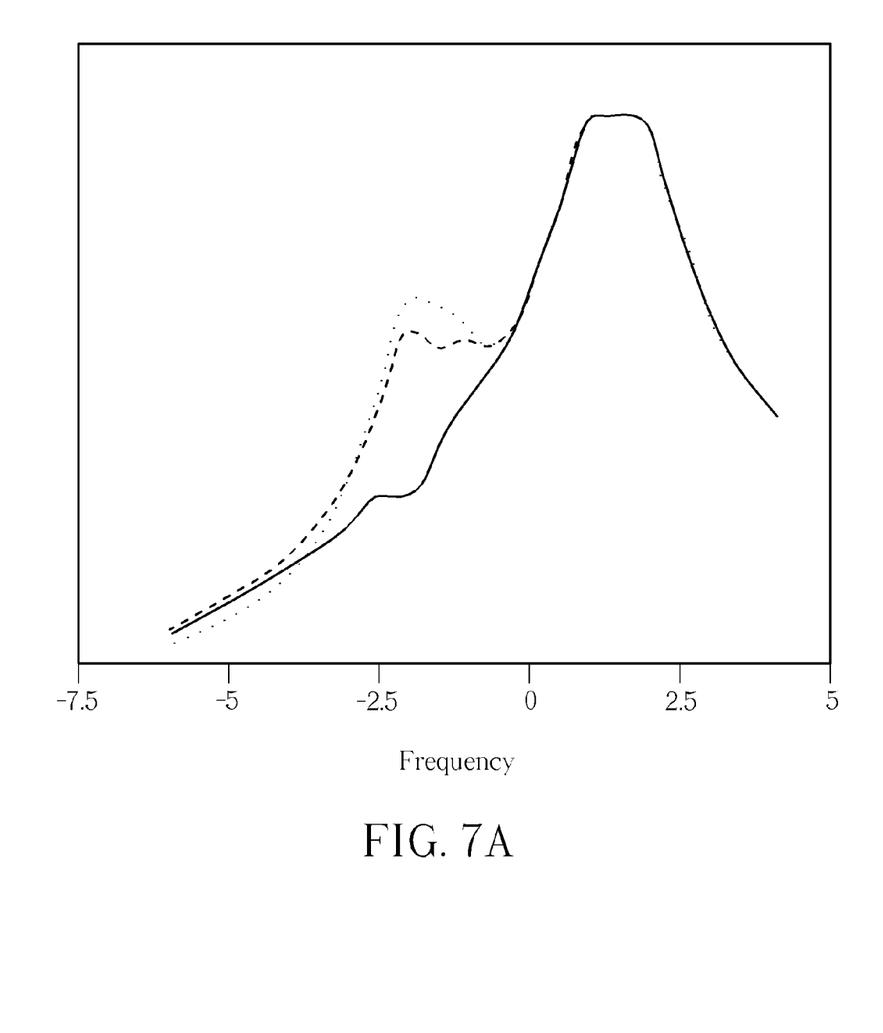
FIG. 7A and FIG. 7B are schematic diagrams of frequency response of real component and imaginary component signals outputted by the complex band-pass filter shown in FIG. 6, respectively.
Figure 7B:
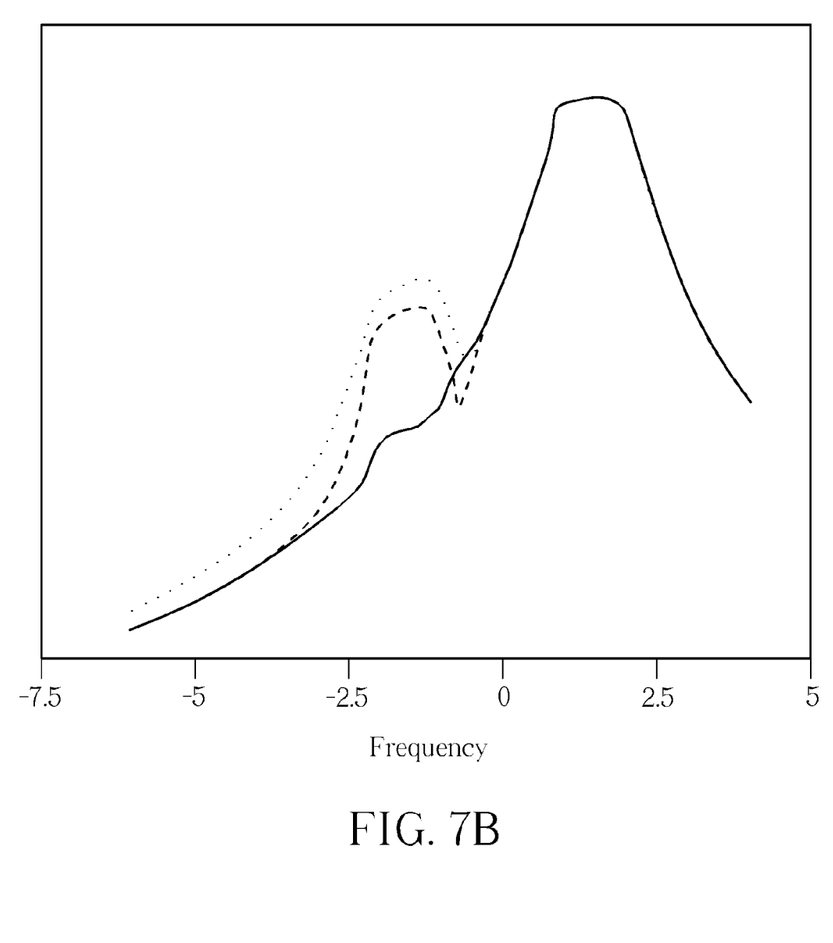

For example, please refer to FIG. 6, which is a schematic diagram of a third-order leapfrog complex band-pass filter 60 according to an embodiment of the present invention. As shown in FIG. 6, two terminals of the input resistors $R_{i1}$, $R_{i2}$ of the complex band-pass filter 60 are coupled to interlaced compensation resistors $R_{\theta 1}$, $R_{\theta 2}$. If the complex band-pass filter 60 is utilized to realize the complex band-pass filter 110 shown in FIG. 1, resistances of the input resistors $R_{i1}$, $R_{i2}$ and the compensation resistors $R_{\theta 1}$, $R_{\theta 2}$ can be adjusted with respect to amplitude and phase portions, to compensate amplitude and phase mismatches, so as to eliminate image signals. For example, FIG. 7A and FIG. 7B are schematic diagrams of frequency responses of real component and imaginary component signals outputted by the complex band-pass filter 60, where the dot lines indicate the frequency responses without amplitude and phase compensation, the dash lines indicate the frequency responses only with amplitude compensation, and the solid lines indicate the frequency responses with both amplitude and phase compensation. As can be seen from FIG. 7A and FIG. 7B, before the amplitudes and phases are completely calibrated, there is a pass band in the negative frequency band. Signals passed through the pass band are folded into the positive frequency band after the ADC, and affect the digital operation of the low IF receiver. In comparison, after adjusting the resistances of the input resistors $R_{i1}$, $R_{i2}$ and the compensation resistors $R_{\theta 1}$, $R_{\theta 2}$, the amplitude and phase mismatches can be compensated, so as to enhance reliability.

Figure 8:
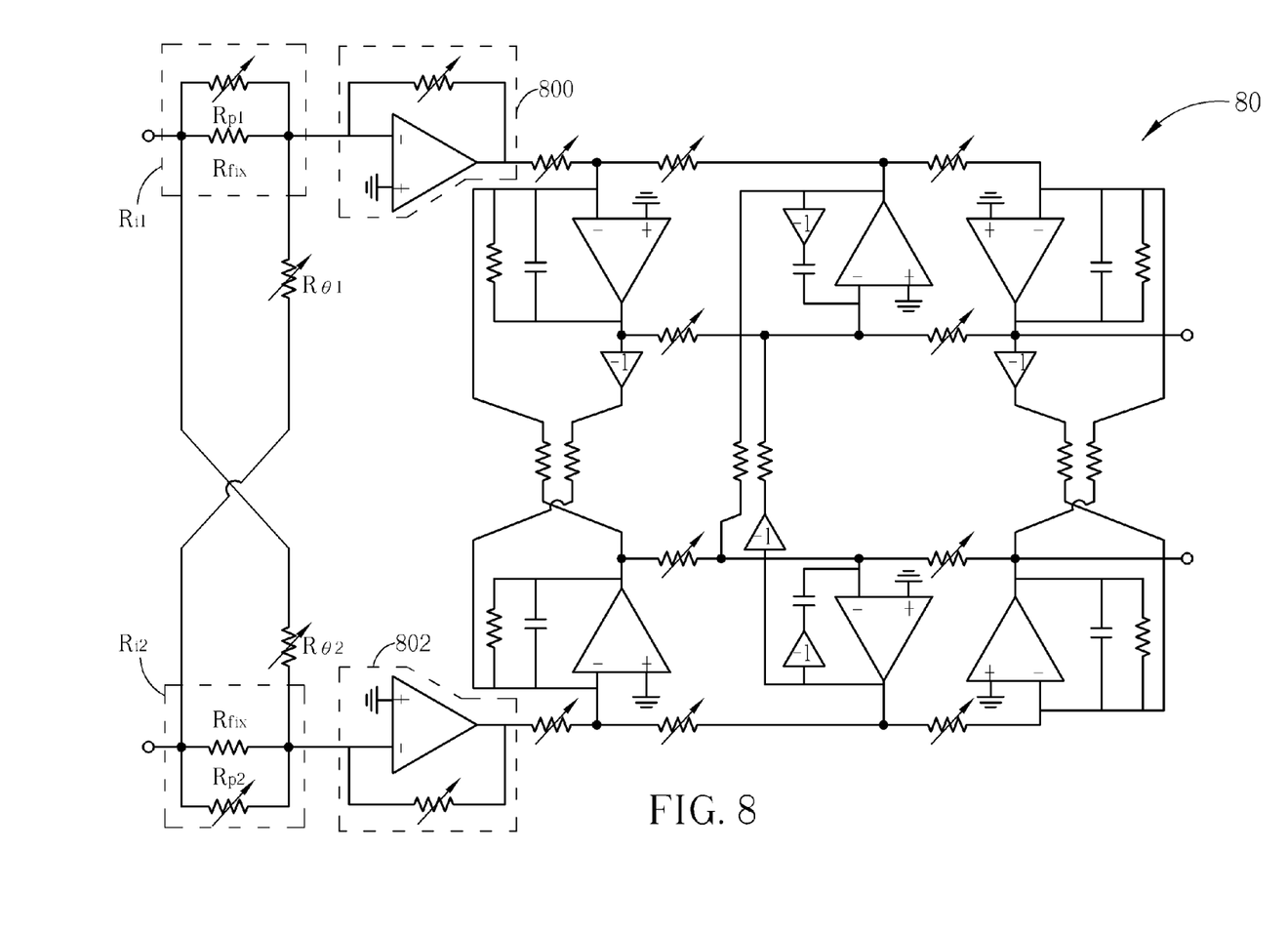
FIG. 8 is a schematic diagram of a third order leapfrog complex band-pass filter according to an embodiment of the present invention.

In FIG. 6, in order to avoid affecting operations of the back-end integrator (low-pass filter) due to adjustment of the input resistors $R_{i1}$, $R_{i2}$, as a complex band-pass filter 80 shown in FIG. 8, buffers 800, 802 are added, the input resistor $R_{i1}$ realized by a resistor $R_{fix}$ and a variable resistor $R_{p1}$ in parallel, and the input resistor $R_{i2}$ is realized by a resistor $R_{fix}$ and a variable resistor $R_{p2}$ in parallel.

Furthermore, when the capacitances of the input resistors $R_{i1}$, $R_{i2}$ and the compensation resistors $R_{\theta 1}$, $R_{\theta 2}$ are adjusted to compensate the amplitude and phase mismatches, it is preferably to calibrate a single sinusoidal image signal, and calibrate the gain first, then the phase. That is, the ratio of the input resistors $R_{i1}$, $R_{i2}$ is adjusted to minimize power of the image signal outputted by the complex filter first, and then the ratio $$\frac{R_{i1}}{R_{\theta 2}}$$

of the input resistor $R_{i1}$ to the resistor $R_{\theta 2}$ or the ratio $$\frac{R_{i2}}{R_{\theta 1}}$$

of the input resistor $R_{i2}$ to the resistor $R_{\theta 1}$ is adjusted to minimize power of the image signal outputted by the complex filter.

Figure 9:
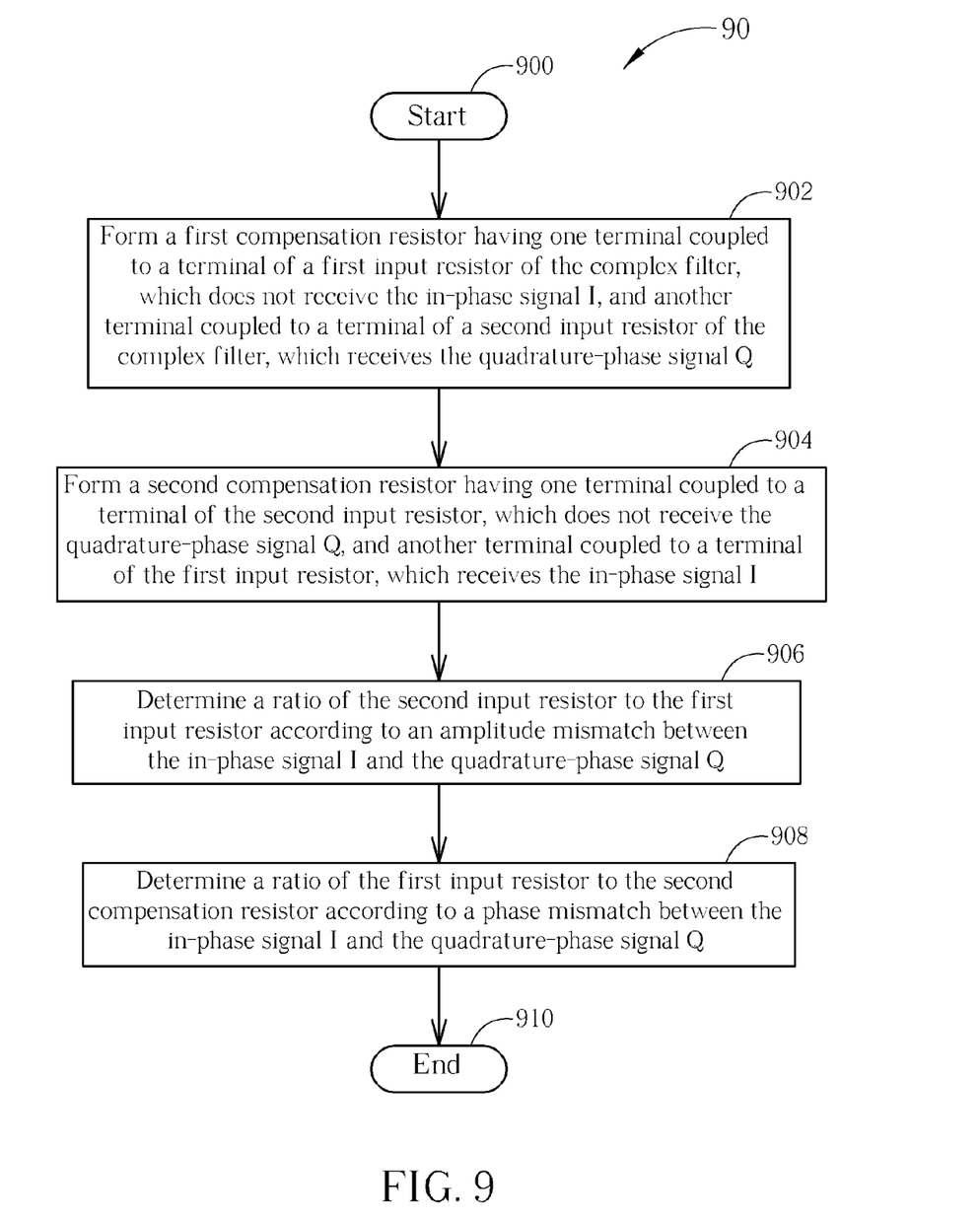
FIG. 9 is a schematic diagram of a calibration process according to an embodiment of the present invention.

Therefore, the gain and phase calibration of the leapfrog complex band-pass filter can be summarized into a calibration process 90, as shown in FIG. 9. The calibration process 90 includes the following steps:

Step 900: Start.

Step 902: Form a first compensation resistor having one terminal coupled to a terminal of a first input resistor of the complex filter, which does not receive the in-phase signal I, and another terminal coupled to a terminal of a second input resistor of the complex filter, which receives the quadrature-phase signal Q.

Step 904: Form a second compensation resistor having one terminal coupled to a terminal of the second input resistor, which does not receive the quadrature-phase signal Q, and another terminal coupled to a terminal of the first input resistor, which receives the in-phase signal I.

Step 906: Determine a ratio of the second input resistor to the first input resistor according to an amplitude mismatch between the in-phase signal I and the quadrature-phase signal Q.

Step 908: Determine a ratio of the first input resistor to the second compensation resistor according to a phase mismatch between the in-phase signal I and the quadrature-phase signal Q.

Step 910: End.

Detailed description of the calibration process 90 can be referred to the above, which is not narrated herein.

To sum up, the present invention adds compensation resistors interlacedly coupled to the input resistors in the complex band-pass filter, and then adjusts the resistances of the input resistors and the compensation resistors with respect to amplitude and phase portions, such that the gain and phase mismatches can be compensated. Therefore, the present invention does not need to modify the original structure of the complex band-pass filter, and only utilizes a small amount of easily integrated compensation resistors to realize phase and amplitude calibration, which neither needs complicated computations, nor adds excessive energy consumption, and therefore significantly improves efficiency of gain and phase calibration.

Those skilled in the art will readily observe that numerous modifications and alterations of the device and method may be made while retaining the teachings of the invention.

What is claimed is:

1. A complex filter for processing an in-phase signal and a quadrature-phase signal, comprising:
   a first low-pass filter, for receiving the in-phase signal and outputting a filtering result;
   a second low-pass filter, for receiving the quadrature-phase signal and outputting another filtering result;
   a connection unit, coupled between the first low-pass filter and the second low-pass filter;
   a first compensation resistor, having one terminal coupled to a terminal of a first input resistor of the first low-pass filter, which does not receives the in-phase signal, and another terminal coupled to a terminal of a second input resistor of the second low-pass filter, which receives the quadrature-phase signal; and
   a second compensation resistor, having one terminal coupled to another terminal of the second input resistor, which does not receive the quadrature-phase signal, and another terminal coupled to another terminal of the first input resistor, which receives the in-phase signal.

2. The complex filter of claim 1, wherein a ratio of the first input resistor to the second compensation resistor is related to a phase mismatch between the in-phase signal and the quadrature-phase signal when phases of the in-phase signal and the quadrature-phase signal are mismatched.

3. The complex filter of claim 1, wherein resistance of the first compensation resistor is greater than resistance of the second input resistor for eliminating a phase mismatch between the in-phase signal and the quadrature-phase signal, and a ratio of the second input resistor to the first input resistor is related to an amplitude mismatch between the in-phase signal and the quadrature-phase signal when amplitudes of the in-phase signal and the quadrature-phase signal are mismatched.

4. The complex filter of claim 1, wherein the first input resistor comprises a fixed value resistor and a variable resistor in parallel.

5. The complex filter of claim 1, wherein the second input resistor comprises a fixed value resistor and a variable resistor in parallel.

6. The complex filter of claim 1 further comprising a buffer unit distinct from a buffer unit of the first low-pass filter and coupled to the terminal of the first input resistor, which does not receive the in-phase signal.

7. The complex filter of claim 1 further comprising a buffer unit distinct from a buffer unit of the second low-pass filter and coupled to the other terminal of the second input resistor, which does not receive the quadrature-phase signal.

8. The complex filter of claim 1, wherein the complex filter is a leapfrog complex band-pass filter.

9. The complex filter of claim 1 further comprising:
   a first buffer unit, distinct from a buffer unit of the first low-pass filter and coupled to the terminal of the first input resistor, which does not receive the in-phase signal; and
   a second buffer unit, distinct from a buffer unit of the second low-pass filter and coupled to the other terminal of the second input resistor, which does not receive the quadrature-phase signal.

10. A calibration method, for eliminating a mismatch between an in-phase signal and a quadrature-phase signal in a receiver, the receiver comprising a complex filter comprising a first low-pass filter and a second low-pass filter, for filtering image signals of the in-phase signal and the quadrature-phase signal, respectively, and a connection unit, coupled between the first low-pass filter and the second low-pass filter, a first compensation resistor having one terminal coupled to a terminal of a first input resistor of the complex filter, which does not receive the in-phase signal, and another terminal coupled to a terminal of a second input resistor of the complex filter, which receives the quadrature-phase signal, and a second compensation resistor having one terminal coupled to another terminal of the second input resistor, which does not receive the quadrature-phase signal, and another terminal coupled to another terminal of the first input resistor, which receives the in-phase signal, the calibration method comprising:
   receiving the in-phase signal and the quadrature-phase signal; and
   determining a ratio of the second input resistor to the first input resistor according to an amplitude mismatch between the in-phase signal and the quadrature-phase signal.

11. The calibration method of claim 10 further comprising determining a ratio of the first input resistor to the second compensation resistor according to a phase mismatch between the in-phase signal and the quadrature-phase signal.

12. The calibration method of claim 10 further comprising setting resistance of the first compensation resistor greater than resistance of the second input resistor for eliminating a phase mismatch between the in-phase signal and the quadrature-phase signal.

13. The calibration method of claim 10 further comprising forming a buffer unit distinct from a buffer unit of the first low-pass filter and coupled to the terminal of the first input resistor, which does not receive the in-phase signal.

14. The calibration method of claim 10 further comprising forming a buffer unit distinct from a buffer unit of the second low-pass filter and coupled to the other terminal of the second input resistor, which does not receive the quadrature-phase signal.

15. The calibration method of claim 10, wherein the complex filter is a leapfrog complex band-pass filter.

16. The calibration method of claim 10 further comprising:
   forming a first buffer unit distinct from a buffer unit of the first low-pass filter and coupled to the terminal of the first input resistor, which does not receive the in-phase signal; and
   forming a second buffer unit distinct from a buffer unit of the second low-pass filter and coupled to the other terminal of the second input resistor, which does not receive the quadrature-phase signal.

* * * * *